United States Patent
Zevenhoven et al.

(10) Patent No.: US 11,656,309 B2
(45) Date of Patent: May 23, 2023

(54) DETERMINING POSITION OF MAGNETIC RESONANCE DATA WITH RESPECT TO MAGNETIC FIELD SENSORS

(71) Applicant: Aalto University Foundation sr, Aalto (FI)

(72) Inventors: Cornelis Zevenhoven, Aalto (FI); Antti Mäkinen, Aalto (FI); Risto Ilmoniemi, Aalto (FI)

(73) Assignee: Aalto University Foundation sr, Aalto (FI)

( * ) Notice: Subject to any disclaimer, the term of this patent is extended or adjusted under 35 U.S.C. 154(b) by 85 days.

(21) Appl. No.: 17/436,627

(22) PCT Filed: Mar. 4, 2020

(86) PCT No.: PCT/FI2020/050138
§ 371 (c)(1),
(2) Date: Sep. 6, 2021

(87) PCT Pub. No.: WO2020/178484
PCT Pub. Date: Sep. 10, 2020

(65) Prior Publication Data
US 2022/0365155 A1    Nov. 17, 2022

(30) Foreign Application Priority Data
Mar. 6, 2019   (FI) .................................. 20195162

(51) Int. Cl.
*G01R 33/44*   (2006.01)
*G01R 33/32*   (2006.01)
*G01R 33/48*   (2006.01)
*G01R 35/00*   (2006.01)

(52) U.S. Cl.
CPC .......... *G01R 33/445* (2013.01); *G01R 33/32* (2013.01); *G01R 33/4808* (2013.01); *G01R 35/00* (2013.01)

(58) Field of Classification Search
CPC .. G01R 33/445; G01R 33/32; G01R 33/4808; G01R 35/00
See application file for complete search history.

(56) References Cited

U.S. PATENT DOCUMENTS

2010/0090697 A1    4/2010   Savukov et al.

FOREIGN PATENT DOCUMENTS

JP         2019134904 A   *   8/2019

OTHER PUBLICATIONS

English Translation of JP-2019134904-A (Year: 2019).*
Dabek et al: SQUID-sensor-based ultra-low-field MRI calibration with phantom images: Towards quantitative imaging. Journal of Magnetic Resonance, Nov. 1, 2012, vol. 224, pp. 22-31.

(Continued)

*Primary Examiner* — G.M. A. Hyder
(74) *Attorney, Agent, or Firm* — Laine IP Oy

(57) ABSTRACT

According to an example aspect of the present invention, there is provided generating, Low-Field-Magnetic Resonance Imaging, LF-MRI, or Ultra-Low-Field Magnetic Resonance Imaging, ULF-MRI, data with respect to an image frame, determining a sensorwise agreement of the data with determined sensitivity profiles, and determining a mapping between the image frame and a sensor frame, such that the sensorwise agreement has been fulfilled.

24 Claims, 4 Drawing Sheets

(56) References Cited

OTHER PUBLICATIONS

Mäkinen et al: Automatic Spatial Calibration of Ultra-Low-Field MRI for High-Accuracy Hybrid MEG-MRI. Arxiv. Org., Cornell University Library, Mar. 15, 2019.
Vesanen et al: Hybrid ultra-low-field MRI and magnetoencephalography system based on a commercial whole-head neuromagnetometer. Magnetic Resonance in Medicine, Jun. 1, 2013. vol. 69, No. 6, pp. 1795-1804.
Vesanen: Combined ultra-low-field MRI and MEG: instrumentation and applications. May 24, 2013, <https://aaltodoc.aalto.fi/handle/123456789/10181>.
Zevenhoven et al: Superconducting receiver arrays for magnetic resonance imaging. May 22, 2018, pp. 1-16, <https://arxiv.org/abs/1805.08867>.
Zotev et al: Microtesla MRI of the human brain combined with MEG. J Magn Reson, Jun. 21, 2008, vol. 194, No. 1, pp. 115-120.
Zotev et al: SQUID-based instrumentation for ultra-low-field MRI. Jul. 30, 2007, <https://arxiv.org/abs/0705.0661>.

\* cited by examiner

DETERMINING POSITION OF MAGNETIC RESONANCE DATA WITH RESPECT TO MAGNETIC FIELD SENSORS

FIELD

The present invention relates to determining the position of magnetic resonance data with respect to magnetic field sensors.

BACKGROUND

Determining the position of data in different coordinate systems is a common problem in medical imaging. For instance, in magnetoencephalography (MEG), neuronal activity estimated from magnetic field measurements with an array of sensors outside the head must be known in the same coordinates as the brain structure. As the overall precision of MEG increases, accurate knowledge of the brain conductivity structure with respect to the magnetic field sensors becomes more and more important for modeling the neuronal fields at the sensors. Independent of this, accurate positional information of the brain anatomy is also essential when setting constraints for reconstructing the neuronal sources. This information usually comes from magnetic resonance (MR) images of the subject's head. Because the brain structure is imaged in a different device, the MRI images and the MEG sensor array have to be aligned, or co-registered, with respect to each other.

Conventional co-registration procedures involve manual steps with several possible error sources complicating the MEG workflow and data analysis. Inaccuracies in the co-registration distort both the conductor model and the source model of the neuromagnetic problem, causing errors in the localization of brain activity. The total co-registration error can be up to 10 mm and, depending on assumptions in the source modeling, it can significantly deteriorate the inverse estimates. Improving the co-registration accuracy in a systematic fashion has thus far involved external equipment, further complicating the workflow.

SUMMARY OF THE INVENTION

The invention is defined by the features of the independent claims. Some specific embodiments are defined in the dependent claims.

According to a first aspect of the present invention, there is provided a method comprising: generating, by a magnetic resonance imaging system comprising sensors arranged at positions around an imaged target volume, Low-Field-Magnetic Resonance Imaging, LF-MRI, or Ultra-Low-Field Magnetic Resonance Imaging, ULF-MRI, data with respect to an image frame; determining, by the magnetic resonance imaging system, a sensorwise agreement of the data with determined sensitivity profiles; and determining, by the magnetic resonance imaging system, a mapping between the image frame and a sensor frame, such that the sensorwise agreement has been fulfilled.

According to a second aspect of the present invention, there is provided a magnetic resonance imaging system comprising sensors arranged at positions around an imaged target volume, comprising means for performing: generating Low-Field-Magnetic Resonance Imaging, LF-MRI, or Ultra-Low-Field Magnetic Resonance Imaging, ULF-MRI, data with respect to an image frame; determining a sensorwise agreement of the data with the determined sensitivity profiles; and determining a mapping between the image frame and a sensor frame, such that the sensorwise agreement has been fulfilled.

According to a third aspect of the present invention, there is provided a non-transitory computer readable medium having stored thereon a set of computer readable instructions that, when executed by at least one processor, cause a magnetic resonance imaging system comprising sensors arranged at positions around an imaged target volume to at least: generate, Low-Field-Magnetic Resonance Imaging, LF-MRI, or Ultra-Low-Field Magnetic Resonance Imaging, ULF-MRI, data with respect to an image frame; determine a sensorwise agreement of the data with determined sensitivity profiles; and determine a mapping between the image frame and a sensor frame, such that the sensorwise agreement has been fulfilled.

According to a fourth aspect of the present invention, there is provided a computer program configured to cause a method in accordance with at least one of claims 1 to 8 to be performed.

Further aspects of the present invention are defined by the appended claims.

EMBODIMENTS

Definitions

Figure 1:
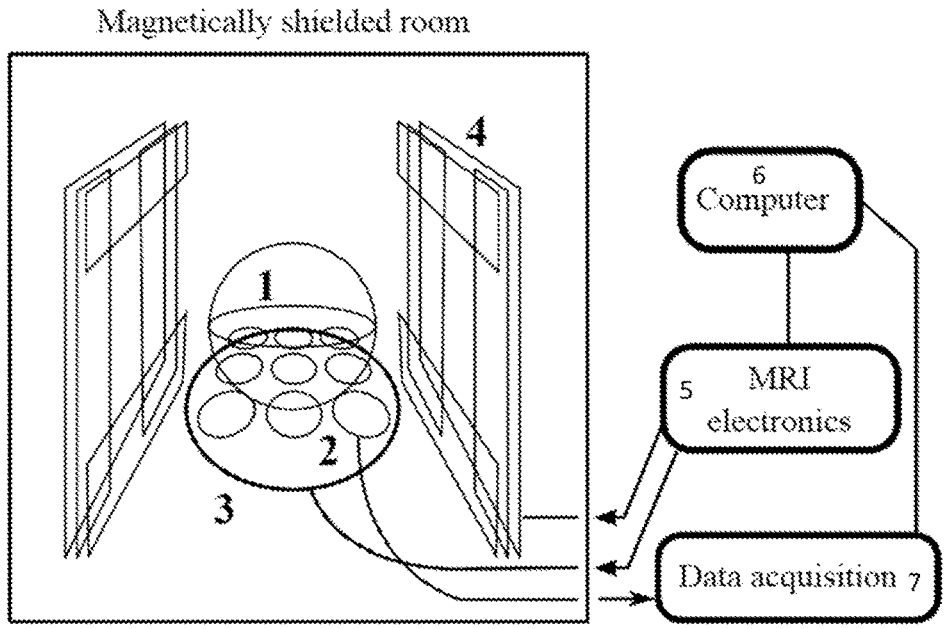
FIG. 1 illustrates a magnetic resonance imaging system in accordance with at least some embodiments of the present invention.

Magnetoencephalography (MEG): a method to localize electrical brain activity from magnetic field measurements outside the head.

Magnetic resonance imaging (MRI): a medical imaging technique to form a three-dimensional image of an object based on controlling nuclear spins in the imaged matter and measuring their magnetic field.

MRI signal: the magnetic field or a quantity related to the magnetic field of precessing nuclear spins.

Measurement sequence: a set of the magnetic field pulses affecting the spins to provide data for image reconstruction Image reconstruction: a method for converting the magnetic field data of the spins to a three-dimensional image.

Imaging phantom or target volume: an object positioned in a field of view of MRI system. The object provides MRI signal when being measured.

Field of view: imaging volume of which the MRI image is taken by generating magnetic field gradients to the volume.

Larmor frequency: the frequency at which the spins precess when being measured, directly proportional to the magnitude of static magnetic field.

Sensor: a measurement device that outputs a reading of the magnetic field or a related quantity at the measurement site.

Sensitivity profile: Strength of the coupling between a sensor and nuclear spins of target volume subjected to magnetic field. The sensitivity profile is a function of position for a given sensor and applied magnetic field by the MRI system. Sensitivity profiles of sensors in a sensor array are determined by geometry, positions and orientations of the sensors in the sensor frame as well as other properties of the setup such as magnetic field directions.

Voxel: volume element in the MRI image grid with a certain position and a numerical value.

Image coordinate system or image frame: a coordinate system in which the voxel positions are known.

Sensor coordinate system or sensor frame: a coordinate system in which sensor sensitivities (sensitivity profiles) are known or modelable.

Mapping: a function that maps the coordinates of a point from the image coordinate system to the sensor coordinate system.

Sensorwise agreement: Consistency of information in the data recorded independently by multiple sensors compared to the set of corresponding sensor-specific models (sensitivity profiles in the sensor frame).

Hybrid MEG-MRI device: A device, e.g. an MRI system, capable of performing MRI and MEG measurements using the same sensors for both modalities.

In connection with generating Low-Field-Magnetic Resonance Imaging, LF-MRI, or Ultra-Low-Field Magnetic Resonance Imaging, ULF-MRI, data by a magnetic resonance imaging system comprising sensors arranged at positions around an imaged target volume, a sensorwise agreement of the data with the sensitivity profiles is determined. A mapping between a LF-MRI or ULF-MRI image frame and a sensor frame is determined so that the sensorwise agreement is fulfilled according to at least one criterion. In this way the image frame and the sensor frame may be calibrated for imaging a person accurately in one or more subsequent imaging sessions.

FIG. 1 illustrates a magnetic resonance imaging system 10 in accordance with at least some embodiments of the present invention. The MRI system is configured for obtaining MRI images of a target volume 1 positioned within an imaging volume of the MRI system. The MRI system 10 is a Low-Field-Magnetic Resonance Imaging, LF-MRI, or an Ultra-Low-Field Magnetic Resonance Imaging, ULF-MRI, system. In an LF-MRI system, magnetic fields of the order of less than 0.3 T are caused to the imaging volume. In an ULF-MRI system, magnetic fields of the order of 10-100 µT a are caused to the imaging volume. Magnetic field and the corresponding Larmor frequency generated by the LF-MRI and ULF-MRI should be sufficiently low so that the sensitivity profiles of the sensors are stable and that the sensitivity profiles of the sensors may be modeled with sufficient accuracy.

The MRI system 10 comprises sensors 2, a polarization coil 3 and MRI coils 4. The MRI coils are configured to generate a magnetic field to the imaging volume. In this way nuclei present in the target volume may generate oscillating electromagnetic signals generated based on energy absorbed from the magnetic field. The electromagnetic signals may be radio frequency signals. The electromagnetic signals may have frequencies for example in the Ultra Low Frequency range, Very Low Frequency band or Low Frequency band or Medium Frequency band or other frequency band defined by the International Telecommunication Union, ITU, Radio Regulations. The MRI coils may comprise a main coil for generating a main magnetic field to the imaging volume and gradient coils for varying the generated main magnetic field.

A prepolarization coil may be provided for prepolarizing the imaged target volume 1 with a magnetic field in the order of 10-100 mT. It should be appreciated that the MRI system may have further coils than described above. For example, the MRI system may have a B1-coil for generating an oscillating reversal pulse to start precession.

The MRI system 10 may comprise MRI electronics 5 for controlling the sensors and coils under control of a computer 6 or a corresponding control unit. The MRI electronics may be configured to perform one or more measurements. The MRI electronics may be configured to determine an MRI measurement sequence and controlling the coils to perform the MRI measurement sequence. Alternatively or additionally, the MRI electronics may be configured to control the sensors to perform MEG measurements.

The computer 6 may be connected to the MRI electronics and data acquisition component for controlling measurements performed by the MRI system 10 and obtaining data generated by the measurements. The computer may comprise or more processor cores connected to a memory. The processors cores may execute computer program instructions such as computer program instructions stored to the memory. The memory may be a non-transitory computer readable medium.

The MRI system 10 may comprise data acquisition component 7 configured to acquire MRI signals and MEG signals from the sensors. The acquired signals from the sensors may be processed by the data acquisition system into a computer-readable format. The computer readable format may be a computer readable file format. MEG and MRI signals may be processed by the data acquisition component into data sets and stored to respective files in the computer readable file format.

The MRI system 10 may comprise sensors 2 for obtaining data for image reconstruction. The data may comprise data sets generated based on MRI and/or MEG signals. The MRI and/or MEG signals may be obtained by the MRI system 10 performing one or more measurements. An MRI signal may be obtained by performing an MRI measurement sequence. An MEG signal may be obtained by performing an MEG measurement. An MRI sequence may comprise generating by the MRI system a set of magnetic field pulses that affect the nuclear spins of the target volume to cause the nuclei of the target volume to generate oscillating electromagnetic signals. In this way data for image reconstruction may be obtained.

The sensors 2 may have geometry, positions and orientations expressed in a sensor coordinate system. In an example, the positions of the sensors may be fixed around the target volume 1. The geometry may be a geometry of an arrangement formed by the sensors, where each sensor may have a position and an orientation. The arrangement of sensors may be formed around the target volume such that the sensitivity profiles of the sensors are directed towards the target volume 1.

The sensors may have sensitivity profiles. A sensitivity profile of a sensor defines strength of coupling between the sensor and the spins of the target volume. The sensitivity profile is a function of position for a given sensor and applied magnetic field by the MRI system to the target volume. Sensitivity profiles of sensors are determined by geometry, positions and orientations of the sensors. The sensitivity profile of a sensor may be derived from the magnetic field generated by a unit current in the sensor's pickup loop. The sensitivity profile comprises of the components of the field of the pickup loop perpendicular to the static magnetic field present in target volume 1.

In an example the sensors may form a sensor array around the target volume 1. The sensor array may have a geometry that consists of the positions and orientations of the sensors. An example of the geometry is that the sensors are arranged to the sensor array in a shape of a helmet.

In an embodiment the sensors 2 may comprise Superconducting QUantum Interference Devices, SQUIDs. The SQUIDs are configured to receive at least MRI signals from the target volume imaged by one or more MRI sequences.

In an embodiment, the sensors 2 may comprise Superconducting QUantum Interference Devices, SQUIDs. The SQUIDs are configured to receive at least MEG signals from the target volume by one or more MEG measurements. In this way the sensors may provide MEG source localization. Accordingly, the SQUIDs may provide means for localizing electrical brain activity from magnetic field measurements outside the imaged target volume, i.e. in this case the head.

A SQUID is a sensitive magnetometer for measuring extremely subtle magnetic fields, based on superconducting loops containing Josephson junctions. The SQUID loops may be small, e.g. smaller than 1 mm, in diameter. Small SQUID loops may be coupled with magnetic sources via larger superconducting pickup coils. A magnetic source may be electric current in the brain related to brain activity or precessing nuclear magnetic moment or any other source of magnetic field. A signal obtained by the SQUID, i.e. a SQUID signal, e.g. an MRI signal or MEG signal, may be thus proportional to the magnetic flux through its pickup coil. A pickup coil may be around 2 cm in diameter, whereby majority of the sensitivity may be focused in a relatively small volume. Further details of the SQUIDs are described in J. Luomahaara, P. T. Vesanen, J. Penttilä, J. O. Nieminen, J. Dabek, J. Simola, M. Kiviranta, L. Grönberg, C. J. Zevenhoven, R. J. Ilmoniemi, and J. Hassel, "All-planar SQUIDs and pickup coils for combined MEG and MRI," Supercond. Sci. Technol., vol. 24, no. 7, p. 075020, 2011.

The MRI system 10 may be configured to perform image reconstruction of MRI and MEG images. Reconstruction of MRI images may be performed on the basis of MRI signals obtained from the sensors 2 and provide a three-dimensional MRI image based on the MRI signals from the imaged target volume. A three-dimensional MRI image may comprise voxels obtained by reconstructing the MRI image on the basis of MRI signals obtained from the sensors 2. The reconstructed MRI image is defined in an image frame. Reconstruction of MEG images may be performed on the basis of MEG signals obtained from the sensors. The reconstructed MEG images are defined in a sensor frame. The MEG images and MRI images may be reconstructed in the same coordinate system by a mapping between the three-dimensional images.

In at least some embodiments, the sensors are configured for magnetoencephalography, MEG, source localization. The sensors may be configured to measure MRI signals and MEG signals by the same sensor geometry. Accordingly, the sensor frame may be maintained between generating the LF-MRI data or ULF-MRI data, and the MEG data. In an example the sensor frame may be maintained, when the positions of the sensors are maintained and the positions of the sensors relative to each other and other parts of the measurement system do not vary between MRI and MEG measurements. In an example of the source localization, a source may be localized based on a magnetic field forward model of the source. The magnetic field forward model comprises the anatomy of the head derived from MRI images and quasistatic Maxwell's equations for an ohmic conductor. Knowing the field of all possible sources, an inverse problem for the source localization may be solved assuming also some a-priori information of the source.

In an example, the target volume 1 may be a homogenous volume, i.e. a phantom, such that, when the target volume is subjected to magnetic field generated by the MRI system, the capability of the target volume to absorb energy from the magnetic field and generated electromagnetic waves may be similar throughout the target volume. The phantom may be used for spatial calibration of the LF-MRI or ULF-MRI image frame and the sensor frame. After the calibration, the MRI system may be used for imaging a person, for example a head of a person. The imaging may be MRI or MEG. The calibration provides that imaging data obtained by the MRI system after the calibration may be localized based on the spatial calibration.

In an embodiment the MRI system is a hybrid MEG-MRI device. With the hybrid MEG-MRI device a co-registration-free workflow can be achieved, when both modalities are measured using the same sensor array. Instead of separately registering an MRI with the MEG array for each individual subject, the hybrid device can be calibrated so that the MRI is automatically reconstructed in the same coordinate system as the MEG.

The hybrid MEG-MRI device may utilize ULF-MRI, where the magnetic fields during the measurement are on the order of 10-100 µT. ULF MRI does not suffer from high-field-related geometrical distortions including effects of radio or microwave frequencies, tissue susceptibility or chemical shifts, and it has been demonstrated to allow imaging in the presence of metals. Furthermore, at ultra-low fields and frequencies, the magnetic fields can be modeled with quasistatic Maxwell equations independently of the subject of imaging.

Figure 2:
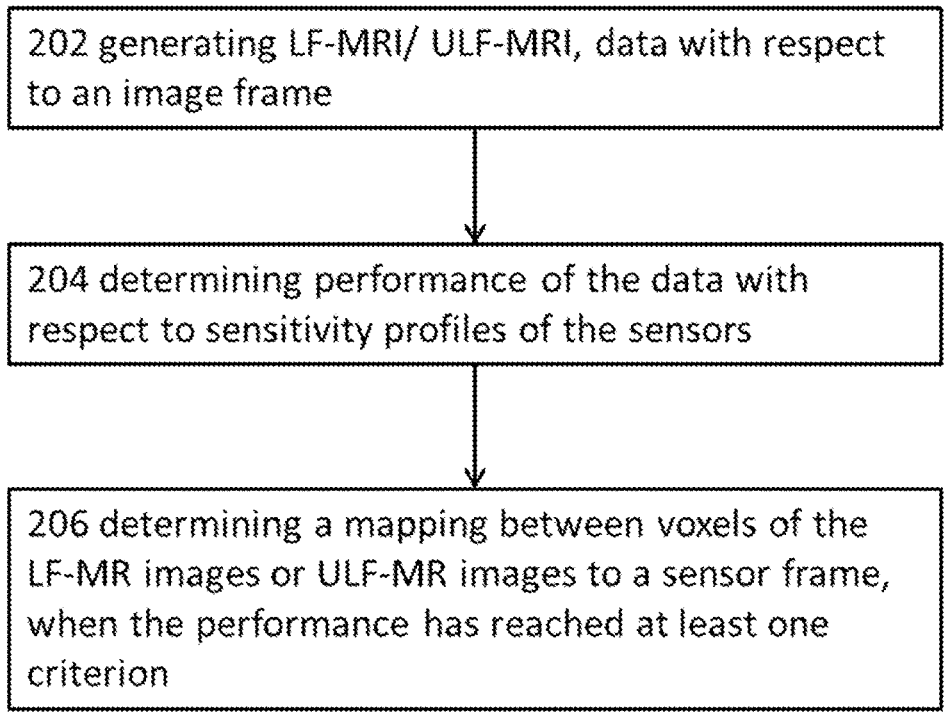
FIG. 2 illustrates a method in accordance with at least some embodiments of the present invention.

FIG. 2 illustrates a method in accordance with at least some embodiments of the present invention. The method may be performed by the MRI system described with FIG. 1. The method provides a mapping for calibration of an image frame and a sensor frame. The calibration provides that imaging data, MEG data sets or MRI data sets, obtained by the MRI system after the calibration may be localized based on the spatial calibration.

Phase 202 comprises generating Low-Field-Magnetic Resonance Imaging, LF-MRI, or Ultra-Low-Field Magnetic Resonance Imaging, ULF-MRI, data with respect to an image frame.

Phase 204 comprises determining a sensorwise agreement of the data with determined sensitivity profiles.

Phase 206 comprises determining a mapping between the image frame and a sensor frame, when the agreement has reached a criterion.

In accordance with at least some embodiments, a mapping for calibration of an image frame and a sensor frame satisfies $r=f(q)$, where r are the coordinates of a point in the sensor frame and q are the coordinates of the same point in the image frame. The mapping $f(q)$ depends on how the sensor frame is located and oriented with respect to the spatial encoding magnetic fields of the MRI system.

According to an embodiment, wherein the sensors are also configured for magnetoencephalography, MEG, the determined mapping may be used in the generation the MEG forward model. In this way the calibration of the image frame and the sensor frame may be utilized for localizing brain activity based on MEG measurements.

According to an embodiment, phase 206 comprises determining the mapping iteratively using a nonlinear optimization method based on a subset of voxels.

Examples of nonlinear optimization methods comprise quasi-Newton algorithms for example Broyden-Fletcher-Goldfarb-Shanno (BFGS).

In an example, the subset may be a portion of the voxels. The voxels may be downsampled such that the subset of voxels comprises voxels evenly from the target volume.

According to an embodiment, phase 206 comprises determining the mapping based on a parametrized transfer function between voxel positions of the image frame and the sensor frame. Parametrization may be used for converting the task of finding a mapping to a nonlinear optimization problem over the parameter space. The parametrization may affect the performance of the optimization and the "landscape" of the objective function (possible local extrema).

The parametrization may be an affine one, f(q)=Aq+b, where A is a 3-by-3 matrix with all the matrix elements considered as free parameters and b is a vector with three elements also considered free parameters.

According to an embodiment, phase 204 comprises that the agreement is assessed based on an objective function that measures the similarity of LF-MRI data or ULF-MRI data and the sensitivity profiles of the sensors.

According to an embodiment, phase 206 comprises that the criterion may be one or more or a combination of the following: a target value of the objective function; a gradient of the objective function satisfying at least one condition; a change of the value of the objective function between iterations is sufficiently small; a predetermined number of iterations for determining parameters for the mapping has been reached.

Examples of the criterion comprise that the target value of the objective function may be a value that is sufficiently close to a known value; the gradient is sufficiently small; the change of the value of the objective function is sufficiently small; and the number of iterations, including a single iteration or more than one iterations, has been reached.

According to an embodiment, phase 206 comprises determining an objective function to reach a target value based on matching, or a similarity of, magnitudes and phases of the sensitivity profiles and the voxel values. The form of the objective function may depend on how the relationship between the voxel values and the sensitivity profiles is modeled.

The target value may be a limit that may be predetermined to indicate sufficient calibration. On the other hand the target value may be the maximum or minimum value of the objective function.

According to an embodiment, phase 204 comprises that the agreement is determined based on an objective function, according to $$g(p) = \frac{\sum_{n=1}^{N_v} |s_n(p)^H u_n|}{\|s(p)\|\|u\|}, \qquad \text{Eq. (1)}$$

where $\|\cdot\|$ denotes the Euclidean vector norm and $(\cdot)^H$ the conjugate transpose, $N_v$ is a subset of voxels, s is a sensitivity vector p is coordinate vector of parameters, u is a voxel vector comprising values of a subset of voxels and g is the objective function.

According to at least some embodiments, a method in accordance with FIG. 2 may be performed by a measurement system capable of magnetic resonance imaging in low or ultra-low fields, for example as described with FIG. 1. With reference to both FIG. 1 and FIG. 2 the system comprises multiple sensors 2 whose positions relative to each other and other parts of the measurement system do not vary during the measurements. The system may be configured to cause a low enough magnetic field and the corresponding Larmor frequency so that the sensitivity profiles of the sensors are stable and that they can be modeled to a sufficient accuracy. The system may be configured to perform measurement methods for obtaining MRI and MEG signals by the sensors 2. The system may be configured to perform one or more reconstruction methods for creating MRI images consisting of voxels with well-defined relative positions. The sensitivity profiles and/or models of the sensitivity profiles of the sensors may be known or determined given the geometry of the sensors and positions of the sensors in the sensor frame. It should be appreciated that the system may have a sufficient stability of the MRI electronics 5 and geometry between calibrations and data acquisitions.

Figure 3:
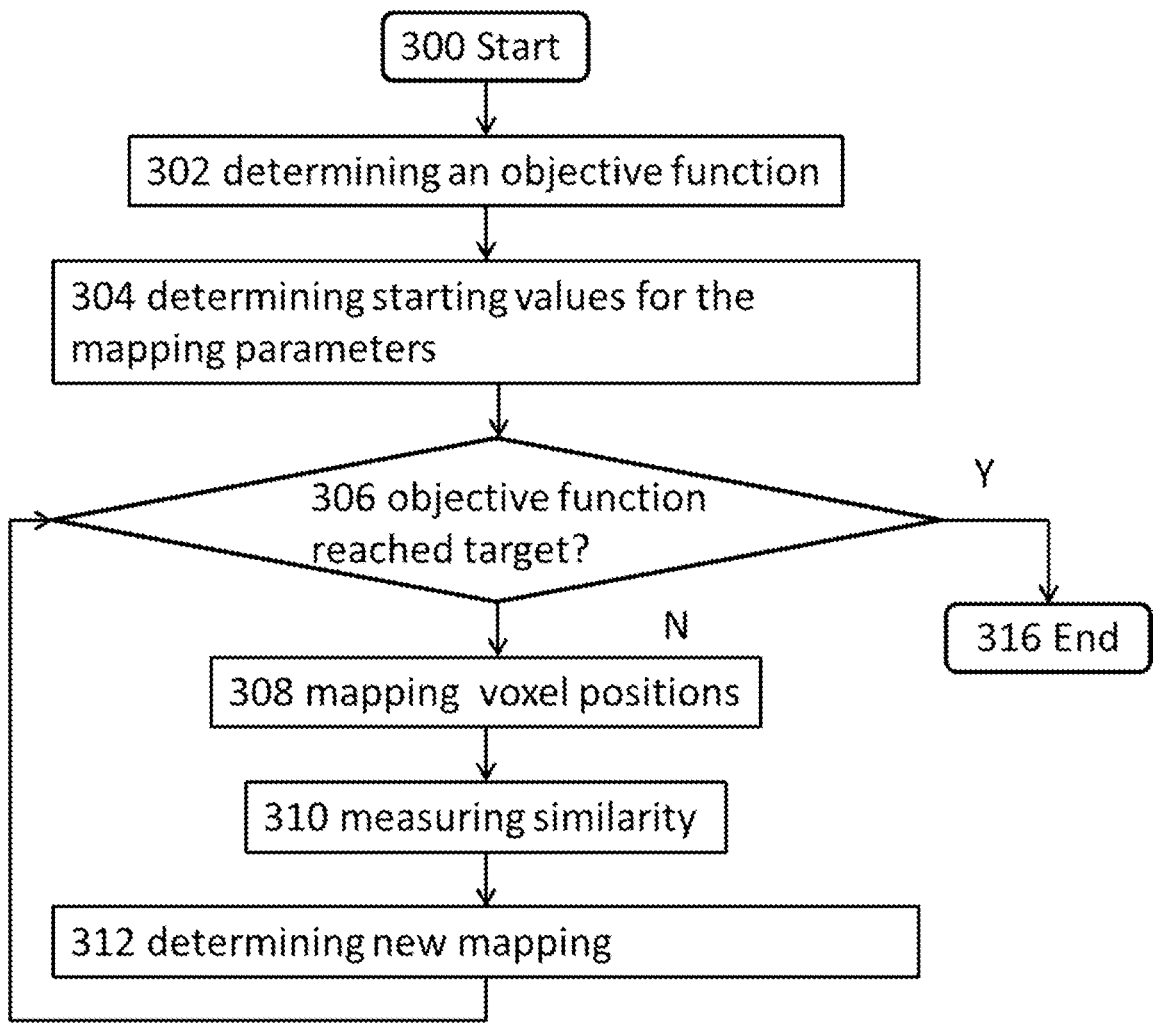
FIG. 3 illustrates a method in accordance with at least some embodiments of the present invention.

FIG. 3 illustrates a method in accordance with at least some embodiments of the present invention. The method provides calibrating an MRI image coordinate system and a sensor coordinate system. The method may be performed by the MRI system described with FIG. 1. The calibration provides that imaging data, MEG data sets or MRI data sets, obtained by the MRI system after the calibration may be localized based on the spatial calibration. The method may start in phase 300. In phase 300 relative positions and orientations of the sensors in the sensor coordinate system may be determined or known. Further phase 300 may comprise determining an MRI measurement sequence and a reconstruction method for which the calibration is performed. Further, phase 300 may comprise, setting a homogeneous or a close-to homogeneous imaging phantom consisting of, e.g. water solution, in the field of view. Further phase 300 may comprise performing the determined measurement sequence for the phantom and recording MRI signals with each sensor in parallel. Further phase 300 may comprise performing the MRI measurement sequence and reconstructing images of the phantom individually for each of the sensors. Further phase 300 may comprise determining initial parameters for the mapping between the sensor coordinate system and the image coordinate system and performing a calibration algorithm in phases 302 to 314 for determining relative positions of the sensors and the MRI voxels.

The calibration algorithm may comprise the following input information a) sensor geometry, positions and orientations in the sensor coordinate system, b) models of the sensitivity profiles in the sensor coordinate system, c) MRI data, e.g. MRI images, of the calibration phantom for each sensor. Each MRI image displays the corresponding sensitivity profile sampled at the voxel positions.

Phases of the calibration algorithm may comprise phase 302 of determining a sensorwise agreement of the data with determined sensitivity profiles based on an objective function for measuring similarity of LF-MRI data or ULF-MRI data and the sensitivity profiles of the sensors, in accordance with phase 204. In an example the LF-MRI data or ULF-MRI data may comprise LF-MRI images or ULF-MRI images reconstructed based on the corresponding data. The objective function may reach a target value, for example the minimum value or the maximum value, of the objective function when the voxel positions coincide with their true positions in the sensor coordinate system. Phases 304 to 316 in FIG. 3 provide an example of implementing phase 206 in FIG. 2. Phase 304 comprises determining starting values for the mapping parameters. Phase 306 comprises determining whether the value of the objective function has reached a target value, for example the minimum or the maximum, of the objective function, and if not continuing to phases 308 for determining mapping parameters for calibrating the coordinate systems. In phase 306, a value of the objective function may be obtained using the current mapping or may be initially the one determined in phase 304. If value of the objective function has reached a target value, for example the minimum value or the maximum value of the objective function, it may be decided that the mapping between the LF-MRI or ULF-MRI image frame and the sensor frame has been determined and the MRI image coordinate system and the sensor coordinate system have been calibrated and the method ends in phase 316.

Phase 308 comprises mapping the voxel positions to the sensor coordinate system with the mapping corresponding to current parameters.

Phase 310 comprises measuring similarity of the images and the sensitivity profile models sampled at the mapped voxel positions by evaluating the objective function.

Phase 312 comprises determining new mapping parameters that give a larger (or smaller) value for the objective function e.g. using a nonlinear optimizer. After phase 312 the method proceeds to phase 306, where the objective function may be evaluated using the new parameters determined in phase 312 as the current mapping parameters.

Figure 4:
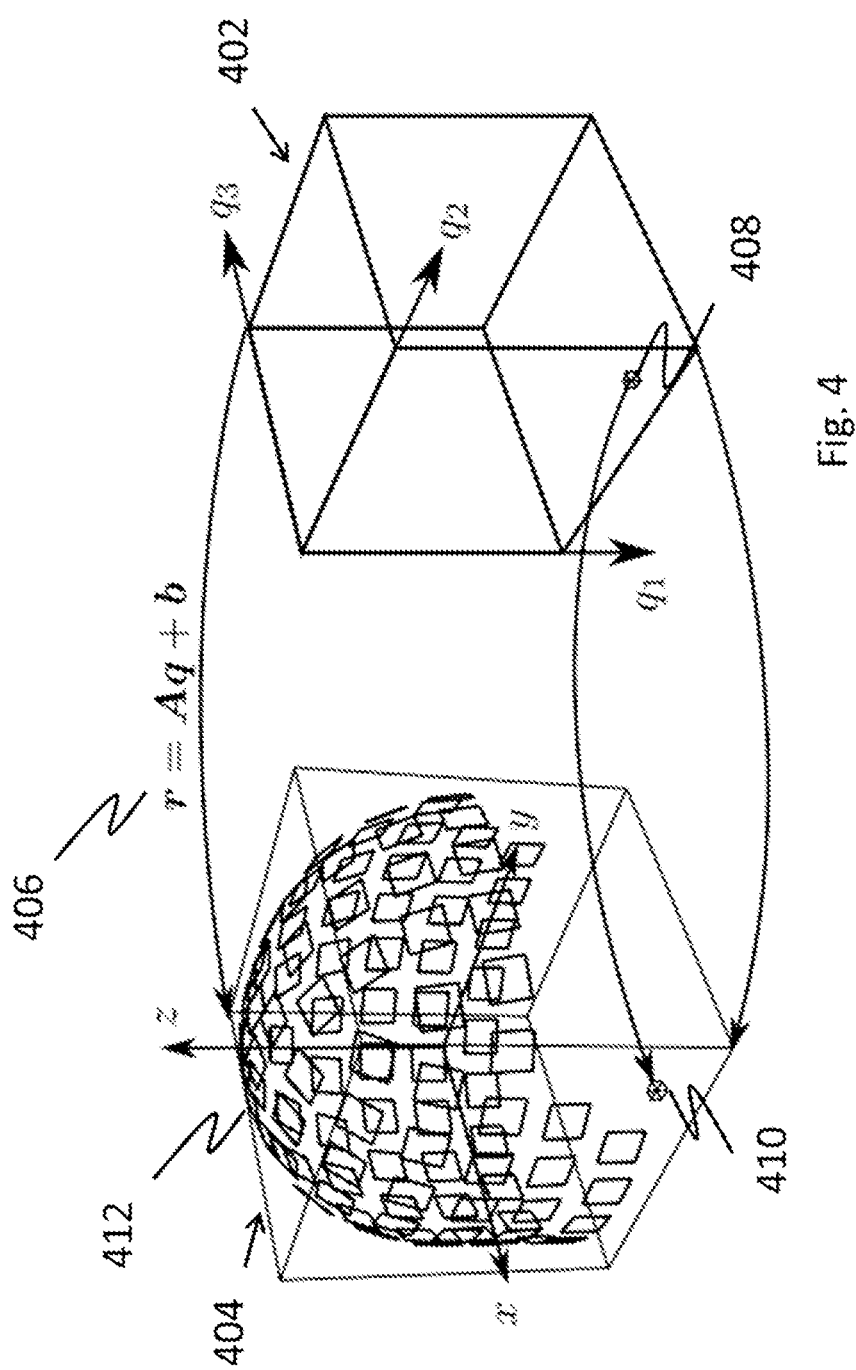
FIG. 4 illustrates an example of a mapping of an image frame to a sensor frame in accordance with at least some embodiments of the present invention.

FIG. 4 illustrates the mapping of an image frame to a sensor frame. The mapping is an example of a mapping, for example the mapping in phase 206 in FIG. 2. Voxels 408 of the image frame 402 may be determined by MRI measurements performed by the MRI system. The voxels 408 may encode spatial information in the image frame 402. A mapping 406 between the image frame and the sensor frame 404 provides that the voxels of the image frame may be mapped to the sensor frame and to voxels 410 of the sensor frame. The sensor frame 404 may be defined based on geometry, positions and orientations of the sensors 412. A mapping between the sensor and image frame 402 may be used for localizing imaging data, for example MRI data sets or MEG data sets, obtained by the MRI system after the calibration.

Figure 5:
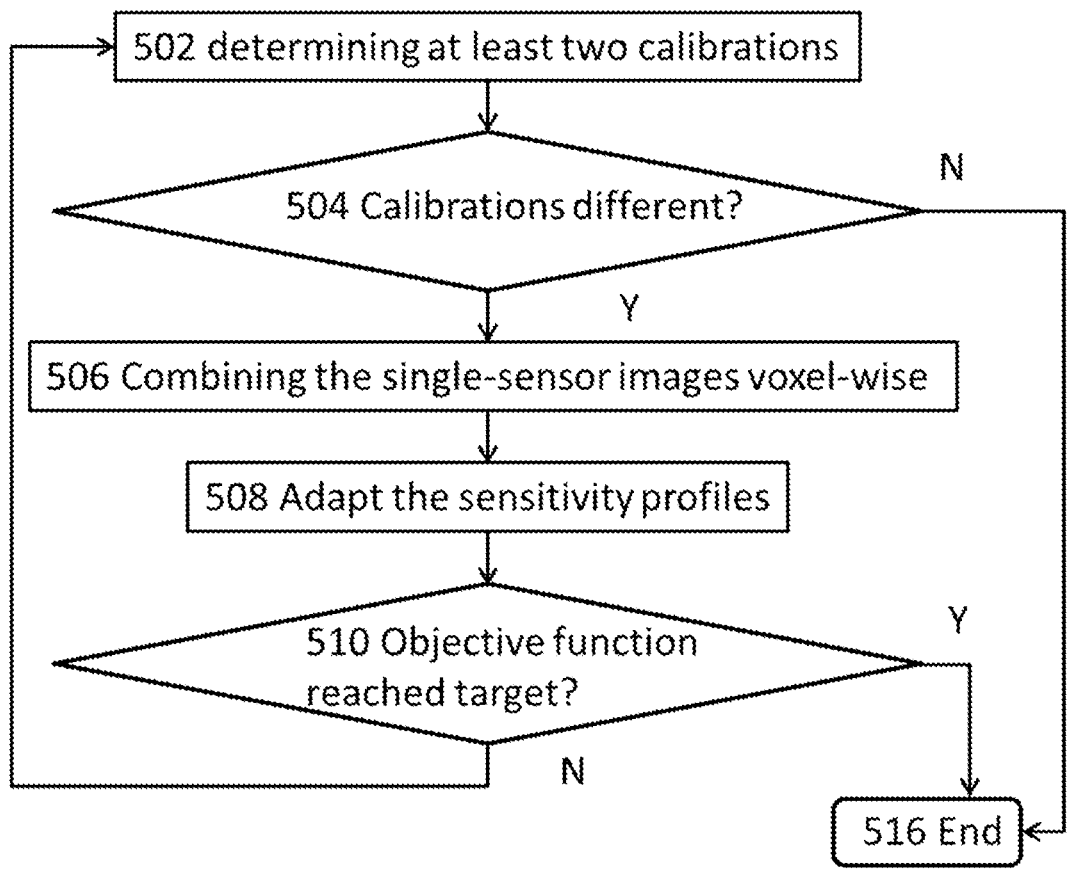
FIG. 5 illustrates a method for determining and correcting calibration errors.

FIG. 5 illustrates a method for determining and correcting calibration errors. The method may be performed by the MRI system described with FIG. 1. The method provides that determined calibration errors may be corrected.

Phase 502 comprises determining at least two calibrations for an image frame and a sensor frame. The calibrations may be determined at different time instants. The calibrations may be obtained by performing the methods in accordance with at least one of FIG. 2 and FIG. 3. In an example the method may be performed after phase 206 in FIG. 2 or in phase 316 of FIG. 3, where the mapping between the image frame and the sensor frame provide the calibration.

Phase 504 comprises determining if the determined calibrations are different. A difference between the calibrations may be determined based on determining values of the objective function for each of the calibrations. If the calibrations are different, the method may proceed to phase 506. If the calibrations are not different, the method may end in phase 516.

Phase 506 comprises combining the single-sensor images voxel-wise to one uniform-sensitivity image assuming the sensitivity profiles evaluated at the mapped voxel positions are at least close to accurate.

A single-sensor image may be determined on the basis of sensitivity profile of a sensor and a magnetization at a voxel position.

The uniform-sensitivity image may be determined on the basis of sensitivity profiles $\beta_j(r)$ of the sensors and a sensitivity vector s described in Eq. (12). Then the uniform uniform-sensitivity image $M_n(p_1)$ may be and expressed by $$M_n(p_1) = \frac{|s_n(p_1)^H u_n|}{\|s(p_1)\|^2} \quad \text{Eq. (2)}$$

where $M_n$ are the voxel values in the uniform-sensitivity images, $p_1$ are the current calibration parameters, $s_n(p_1)$ are sensitivity vectors and $u_n$ are voxel vectors containing the voxel values of single sensor images.

Phase 508 comprises adapting the sensitivity profiles. Each sensitivity profile may be multiplied with an inhomogeneity for adapting the sensitivity profiles. In this way, calibration errors may be corrected. The estimated common non-uniformity may be added to the profiles to comply with the assumption of uniform image magnitude used in the calibration, for example in phase 306-312.

Phase 510 may comprise determining whether the value of an objective function has reached a target value, for example the minimum value or the maximum value of the objective function, in accordance with phase 306. If the target value, for example the minimum value or the maximum value, have been reached, the method may end in phase 516. Otherwise the method may proceed to phase 502, where one or more further calibrations are determined, for example by performing phases 308 to 312 of FIG. 3.

Examples of processing performed by an MRI system in accordance with at least some embodiments are now described based on a signal model of signals obtained by the sensors of the MRI system by performing an imaging sequence. For a time-varying nuclear magnetization $\vec{M}$ in a target volume, the resulting flux through a pickup coil (from now on indexed with j) of an array of sensors may be modeled as $$\Psi_j(t) = LPF\{\Phi_j(t)e^{-i\omega_0 t}\} \quad \text{Eq. (3)}$$
$$= \int \beta_j^*(\vec{r}) M_\perp(\vec{r}) e^{i\varphi_0(\vec{r})} e^{i\varphi_{enc}(\vec{r},t)} d^3\vec{r},$$

where LPF stands for low pass filtering, $\beta_j^*(\vec{r})$ is the complex sensitivity profile, $\varphi_0(\vec{r})$ is the initial phase of the magnetization, where $\varphi_{enc}(\vec{r}, t) = \int_0^t \Delta\omega(\vec{r}, t')dt'$ is the phase due to spatial encoding gradients.

The MRI system may perform image reconstruction from a finite set of data points $\Psi_{j,m}$ corresponding to the accrued phase $\varphi_{enc}(\vec{r}, t)$ at acquisition times $t_m$, where the index m covers all the acquisition during the imaging sequences. The image may be reconstructed as numerical values assigned to image voxels, whose positions in the three-dimensional voxel array may be identified with a triple-index $q_n \in \mathbb{Z}^3$. Furthermore, any point between the voxel positions can be represented by a coordinate vector $q \in \mathbb{R}^3$ taking values between different $q_n$. On the other hand, positions $\vec{r}$ in space can be determined using array-frame coordinates used for representing the geometry of the sensor array. Assuming the position vector $\vec{r}$ has the same origin as our array coordinate system, these coordinates are projections of $\vec{r}$ to the array coordinate axes $r=[\vec{r} \cdot \hat{e}_x, \vec{r} \cdot \hat{e}_y, \vec{r} \cdot \hat{e}_z]^T = [x, y, z]^T$.

Assuming direct Cartesian Fourier imaging, the phase $\varphi_{enc}$ is encoded across the acquisitions using uniform gradients of $\vec{B}[\vec{r}, t]^T \cdot \hat{e}_0$ so that the inverse discrete Fourier transform (IDFT) may be used to reconstruct the image. Then, the encoded phase can be written as $\varphi_{enc}(r, t_m) = 2\pi k_m^T q(r)$, where $q = f^{-1}(r)$ and $k_m$ corresponds to a normalized spatial frequency in a three-dimensional discrete Fourier transform (DFT).

Changing the notation to the coordinate presentation defined above, the data points obtained by Eq. 3 are now given by $$\Psi_{j,m} = \int \beta_j^*(r) M_\perp(r) e^{i\varphi_0(r)} e^{-i2\pi k_m^T q(r)} d^3 r \quad \text{Eq. (4)}$$

$$= \int \beta_j^*(f(q)) M_\perp(f(q)) e^{i\varphi_0(f(q))} |\det J(q)| \times e^{-i2\pi k_m^T q} d^3 q$$

where variables have been changed and the Jacobian of f(q) is denoted by J(q). Here $\Psi_{j,m}$ corresponds to a value sampled from the Fourier transform of a sensitivity-weighted image $$W_j(q) = \beta_j^*(f(q)) M_\perp(f(q)) e^{-i\varphi_0(f(q))} |\det J(q)|. \quad \text{Eq. (5)}$$

Reconstructing the data in Eq. (4) with IDFT we get the value of voxel, indexed with n, centered at $q_n$:

$$U_{j,n} = \sum_m e^{i2\pi k_m^T q_n} \Psi_{j,m} \quad \text{Eq.(6)}$$

$$= \int W_j(q) \sum_m e^{i2\pi k_m^T (q_n - q)} d^3 q$$

$$= \int W_j(q) SRF(q_n - q) d^3 q,$$

where the SRF is spatial response function $$SRF(q) = \sum_m e^{i2\pi k_m^T q}, \quad \text{Eq. (7)}$$

and the summation is over all spatial frequencies of the tree dimensional DFT. The SRF may be the periodic sinc function, also known as the Dirichlet kernel.

An example of calibration is described next based on the consistency between imaged data and the signal model in Eqs. (5) and (6).

The calibration task is to determine the mapping f such that the signal equations for $U_{j,n}$ hold. For this, images of a phantom with ideally uniform magnetization strength $M_\perp$ are obtained by the MRI system. However, as the prepolarization field strength $B_p$ may not be uniform, this ideal situation may not be achieved in practice. For approximating Eq. (5) SRF is modified by applying a window function to the k-space data. Using a Hann window $\Pi_{Hann}(k_m)$, the modified SRF becomes $$\widetilde{SRF}(q) = \sum_m \Pi_{Hann}(k_m) e^{i2\pi k_m^T q}. \quad \text{Eq. (8)}$$

After the Hann windowing, side lobes of the SRF become attenuated, while only minimally widening the main lobe. The Hann windowing also provides that the phase $\varphi_0(f(q))$ and the Jacobian J(q) may be approximated as being uniform within the main lobe of the SRF, which is now the effective voxel volume. Considering only the voxels whose main lobes are fully included in the phantom (interior voxels), also $M_\perp(f(q))$ may be approximated uniform within each of these voxels. this allows the following approximation for the interior voxels $$U_{j,n} \approx M_\perp(f(q_n)) e^{i\varphi_{0,n}} |\det J(q_n)| \times \int \widetilde{SRF}(q_n - q) \beta_j^*(f(q)) d^3 q, \quad \text{Eq. (9)}$$

where $\varphi_{0,n} = -\varphi_0(f(q_n))$ is the initial voxel phase. Equation (9) suggests convolving the sensitivities $\beta_j$ with the SRF for accurate modeling of $U_{j,n}$. The convolution can be evaluated simply as $\beta_j(f(q_n))$ and the approximation of voxel value becomes $$U_{j,n} \approx W_j(q_n) = \beta_j^*(f(q_n)) M_\perp(f(q_n)) e^{i\varphi_{0,n}} |\det J(q_n)|. \quad \text{Eq. (10)}$$

To conclude, the interior voxel values $U_{j,n}$ correspond to the profiles $\beta_j^*(f(q_n))$ apart from the factor $M_\perp(f(q_n))(f(q_n)) e^{i\varphi_{0,n}} |\det J(q_n)|$ and measurement noise. The Jacobian is uniform unless the mapping f is nonlinear. When only the interior voxels are used, the shape of the phantom does not play a role in the voxel signal model used for the calibration. To search for the mapping that would ensure consistency of the signal model, f may be parametrized with a certain set of parameters $p \in R^{N_p}$. Then the mapping may be determined by an optimization task. To this end, a subset of $N_v$ voxels may be selected inside the phantom and their indices may be denoted by $v_1, \ldots, v_{N_v}$. For each voxel, a voxel vector $u_m \in \mathbb{C}^{N_v N_c}$ is formed, where $[u_m]_j = U_{j,v_m}$ and $N_c$ is the number of pickup coils. In other words, each vector $u_m$ consists of the values of the $v_m^{th}$ voxel in $N_c$ single-channel images. By concatenating vectors $u_m$ the selection of MRI data may be represented as a single vector in $\mathbb{C}^{N_v N_c}$ $$u = [u_1^T \ldots u_{N_v}^T]^T. \quad \text{Eq. (11)}$$

Similarly to vector u a sensitivity vector maybe expressed $$s(p) = [s_1^T \ldots s_{N_v}^T]^T, \quad \text{Eq. (12)}$$

where the $j^{th}$ element of the $m^{th}$ subvector is $[s_m]_j = \beta_j^*(f(q_{v_m}|p)) |\det J(q_{v_m}|p)|$.

Consistency of the spatial information in the sensitivity vector s with the imaged data u may be determined by optimizing according to $$\hat{p} = \underset{p}{\arg\max}\, g(p), \quad \text{Eq. (13)}$$

where g is objective function, which is insensitive to both $M_\perp$ and the voxel phase $\varphi_{0,n}$ and preferably whose optimum is not biased by noise in u and p is coordinate vector of parameters. The objective function may be selected in various ways. However, it is important to utilize the spatial information in the phase of the sensitivity profiles while taking into account the fact that unknown factors may affect the voxel phase at the time of spatial calibration Eq. (3) gives an example of the objective function.

An embodiment concerns a non-transitory computer readable medium having stored thereon a set of computer readable instructions that, when executed by at least one processor, cause magnetic resonance imaging system comprising sensors arranged at positions around an imaged target volume to perform one or more operations and/or methods described herein.

An embodiment concerns a computer program configured to cause one or more operations in accordance with a method described herein. The one or more operations in accordance with a method may be performed, when executed by a computer or a corresponding control unit of an MRI system.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

INDUSTRIAL APPLICABILITY

At least some embodiments described herein are applicable in calibrating MRI imaging systems.

Acronyms List

BFGS Broyden-Fletcher-Goldfarb-Shanno
DFT Discrete Fourier Transform
IDFT Inverse Discrete Fourier Transform
ITU International Telecommunication Union
LF-MRI Low-Field-Magnetic Resonance Imaging
LPF Low Pass Filtering
MEG Magnetoencephalography
MR Magnetic Resonance
MRI Magnetic resonance imaging
SRF Spatial Response Function
SQUID Superconducting QUantum Interference Device
ULF-MRI Ultra-Low-Field Magnetic Resonance Imaging

REFERENCE SIGNS LIST

1 Target volume
2 Sensors
3 Polarization coil
4 MRI coils
5 MRI electronics
6 Computer
7 Data acquisition component
10 MRI system
202 to 206 Phases of the method of FIG. 2
300 to 316 Phases of the method of FIG. 3
402 Image frame
404 Sensor frame
406 Mapping
408 Voxels of image frame
410 Voxels of sensor frame
412 Sensors
502 to 516 Phases of FIG. 5

The invention claimed is:

1. A method comprising:
generating, by a magnetic resonance imaging system comprising sensors arranged at positions around an imaged target volume, Low-Field-Magnetic Resonance Imaging, LF-MRI, or Ultra-Low-Field Magnetic Resonance Imaging, ULF-MRI, data with respect to an image frame;
determining, by the magnetic resonance imaging system, a sensorwise agreement of the data with determined sensitivity profiles; and
determining, by the magnetic resonance imaging system, a mapping between the image frame and a sensor frame, such that the sensorwise agreement has been fulfilled.

2. The method according to claim 1, wherein the sensors are configured for magnetoencephalography, MEG, source localization, and the method further comprises:
obtaining, by the sensors one or more MEG data sets; and
localizing at least one source of electrical brain activity of the MEG data sets based on the determined mapping.

3. The method according to claim 2, wherein the sensor frame is maintained between generating the LF-MRI data or ULF-MRI data, and the MEG data.

4. The method according to claim 1, wherein the mapping is determined iteratively using a nonlinear optimization method based on a subset of voxels.

5. The method according to claim 1, wherein the mapping is determined based on solving a parametrized transfer function between voxel positions of the image frame and the sensor frame.

6. The method according to claim 1, wherein the sensorwise agreement is based on an objective function for measuring similarity of LF-MRI data or ULF-MRI data and the sensitivity profiles of the sensors.

7. The method according to claim 6, wherein the criterion comprises one or more or a combination of the following:

a target value of the objective function,
a gradient of the objective function satisfying at least one condition,
a change of the value of the objective function between iterations is sufficiently small,
a predetermined number of iterations for determining parameters for the mapping has been reached.

8. The method according to claim 6, wherein the objective function is determined to reach a target value based on matching, or a similarity of, magnitudes and phases of the sensitivity profiles and the voxels.

9. The method according to claim 6, wherein the agreement is determined based on an objective function, according to $$g(p) = \frac{\sum_{n=1}^{N_v} |s_n(p)^H u_n|}{\|s(p)\|\|u\|},$$

where $\|\cdot\|$ denotes the Euclidean vector norm and $(\cdot)^H$ the conjugate transpose, $N_v$ is a subset of voxels, s is a sensitivity vector, p is coordinate vector of parameters, u is a voxel vector comprising values of a subset of voxels and g is the objective function.

10. The method according to claim 1, wherein the sensorwise agreement is fulfilled according to at least one criterion.

11. The method according to claim 1, wherein the sensors comprise Superconducting QUantum Interference Devices, SQUIDs.

12. A magnetic resonance imaging system comprising sensors arranged at positions around an imaged target volume, comprising means for performing:
generating Low-Field-Magnetic Resonance Imaging, LF-MRI, or Ultra-Low-Field Magnetic Resonance Imaging, ULF-MRI, data with respect to an image frame;
determining a sensorwise agreement of the data with determined sensitivity profiles; and
determining a mapping between the image frame and a sensor frame, such that the sensorwise agreement has been fulfilled.

13. The magnetic resonance imaging system according to claim 12, wherein the sensors are configured for magnetoencephalography, MEG, source localization, and the method comprises:
obtaining, by the sensors one or more MEG data sets; and
localizing at least one source of electrical brain activity of the MEG data sets based on the determined mapping.

14. The magnetic resonance imaging system according to claim 13, wherein the sensor frame is maintained between generating the LF-MRI data or ULF-MRI data, and the MEG data.

15. The magnetic resonance imaging system according to claim 12, wherein the mapping is determined iteratively using a nonlinear optimization method based on a subset of voxels.

16. The magnetic resonance imaging system according to claim 12, wherein the mapping is determined based on solving a parametrized transfer function between voxel positions of the image frame and the sensor frame.

17. The magnetic resonance imaging system according to claim 12, wherein the sensorwise agreement is measured based on an objective function for measuring similarity of LF-MRI data or ULF-MRI data and the sensitivity profiles of the sensors.

18. The magnetic resonance imaging system according to claim 17, wherein the criterion comprises one or more or a combination of the following:
a target value of the objective function,
a gradient of the objective function satisfying at least one condition,
a change of the value of the objective function between iterations is sufficiently small,
a predetermined number of iterations for determining parameters for the mapping has been reached.

19. The magnetic resonance imaging system according to claim 17, wherein the target value of the objective function is determined to reach a target value based on matching, or a similarity of, magnitudes and phases of the sensitivity profiles and the voxels.

20. The magnetic resonance imaging system according to claim 17, wherein the agreement is determined based on an objective function, according to $$g(p) = \frac{\sum_{n=1}^{N_v} |s_n(p)^H u_n|}{\|s(p)\|\|u\|},$$

where $\|\cdot\|$ denotes the Euclidean vector norm and $(\cdot)^H$ the conjugate transpose, $N_v$ is a subset of voxels, s is a sensitivity vector, p is coordinate vector of parameters, u is a voxel vector comprising values of a subset of voxels and g is the objective function.

21. The magnetic resonance imaging system according to claim 12, wherein the sensorwise agreement is fulfilled according to at least one criterion.

22. The magnetic resonance imaging system according to claim 12, wherein the sensors comprise Superconducting QUantum Interference Devices, SQUIDs.

23. The magnetic resonance imaging system according to claim 12, wherein the magnetic resonance imaging system is a hybrid MEG-MRI device.

24. The magnetic resonance imaging system according to claim 12, wherein the means comprises at least one processor; and at least one memory including computer program code, the at least one memory and computer program code configured to, with the at least one processor, cause the performance of the magnetic resonance imaging system.

* * * * *